United States Patent
Hasegawa et al.

(10) Patent No.: US 8,211,337 B2
(45) Date of Patent: Jul. 3, 2012

(54) MATERIAL FOR TRANSPARENT CONDUCTIVE FILM AND TRANSPARENT CONDUCTIVE FILM

(75) Inventors: Akira Hasegawa, Tsukuba (JP); Takeshi Hattori, Abiko (JP); Yuzo Shigesato, Yokohama (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 198 days.

(21) Appl. No.: 12/531,442

(22) PCT Filed: Mar. 14, 2008

(86) PCT No.: PCT/JP2008/055188
§ 371 (c)(1),
(2), (4) Date: Nov. 4, 2009

(87) PCT Pub. No.: WO2008/114850
PCT Pub. Date: Sep. 25, 2008

(65) Prior Publication Data
US 2010/0044649 A1    Feb. 25, 2010

(30) Foreign Application Priority Data
Mar. 16, 2007  (JP) .................. 2007-068044

(51) Int. Cl.
*H01B 1/08* (2006.01)
*C23C 14/24* (2006.01)

(52) U.S. Cl. ............. 252/519.51; 252/520.1; 204/192.15

(58) Field of Classification Search ............. 252/519.51, 252/520.1; 427/58, 96.1; 204/192.15, 192.29
See application file for complete search history.

(56) References Cited

U.S. PATENT DOCUMENTS

| 2004/0081836 A1 | 4/2004 | Inoue et al. |
| 2005/0199895 A1 | 9/2005 | Seong et al. |
| 2007/0215456 A1* | 9/2007 | Abe et al. ............. 204/192.15 |
| 2009/0065746 A1 | 3/2009 | Hattori et al. |
| 2009/0130418 A1* | 5/2009 | Odaka et al. ............. 428/220 |

FOREIGN PATENT DOCUMENTS

| CN | 1677703 A | 10/2005 |
| CN | 1869277 A | 11/2006 |
| EP | 0354769 A2 | 2/1990 |
| JP | 02149459 A | 6/1990 |
| JP | 08171824 A | 7/1996 |
| JP | 09035535 A | 2/1997 |
| JP | 2004068054 A | 3/2004 |
| JP | 2005171359 A | 6/2005 |
| JP | 2005306684 A | 11/2005 |
| WO | 2008084865 A1 | 7/2008 |

OTHER PUBLICATIONS

English langauge translation of JP 2005-171359.*
Machine-generated English Translation of JP 2005-306684.

* cited by examiner

*Primary Examiner* — Mark Kopec
(74) *Attorney, Agent, or Firm* — Sughrue Mion, PLLC

(57) ABSTRACT

The present invention relates to a material for making a transparent conductive film, and a transparent conductive film. The material for making the transparent conductive film is composed of a mixed metal oxide comprising Zn, Sn, O, and at least one doping element selected from the group consisting of Sc, Bi, Cu, Y, La, Ag, and Au.

7 Claims, No Drawings

MATERIAL FOR TRANSPARENT CONDUCTIVE FILM AND TRANSPARENT CONDUCTIVE FILM

This application is the U.S. national phase application under 35 U.S.C. §371 of International Patent Application No. PCT/JP2008/055188 filed Mar. 14, 2008, which claims the benefit of priority to Japanese Patent Application No. 2007-068044 filed Mar. 16, 2007, the disclosures of all of which are hereby incorporated by reference in their entireties. The International Application was published in Japanese on Sep. 25, 2008 as WO 2008/114850.

FIELD OF THE INVENTION

The present invention relates to material for a transparent conductive film, and a transparent conductive film.

BACKGROUND

Transparent conductive films serve as electrodes for displays such as liquid crystal displays, organic electroluminescent displays, plasma displays, and the like, and serve as electrodes for photovoltaic cells, heat ray reflective films for windows, antistatic films, and the like. As transparent conductive films, $ZnO$—$SnO_2$ system films are known, and Japanese Patent Laid-Open Publication H9-35535 discloses a film wherein Sn/Zn is not less than 0.6 and not more than 0.75, and includes Al, Ga, or In as an additive (a doping element).

However, the transparent conductive film set forth in this publication is inadequate in terms of resistivity.

The object of the present invention is to provide a transparent conductive film, and material for a transparent conductive film for the fabrication thereof, wherein the resistivity is adequately low in practice.

SUMMARY OF THE INVENTION

Through extensive research, the present inventors arrived at the present invention in order to solve the problem set forth above. That is, the present invention provides <1> through <7>, as follows:

<1> Material for a transparent conductive film made from a metal mixed oxide including Zn, Sn, O, and at least one doping element selected from the group consisting of Sc, Bi, Cu, Y, La, Ag, and Au;

<2> A material as set forth in <1>, wherein one doping element is selected from the group consisting of Sc, Bi, Cu, Y, La, Ag, and Au;

<3> A material as set forth in <1> or <2>, wherein the molar ratio of the doping element:Sn is between 0.01:99.99 and 20:80;

<4> A material as set forth in <1> or <2>, wherein the molar ratio of the doping element:Zn is between 0.01:99.99 and 20:80;

<5> A material as set forth in any of <1> through <4>, wherein the material is a sintered body;

<6> A method for manufacturing a transparent conductive film, comprising a deposition step using the material set forth in <5> as a target; and <7> A transparent conductive film made from a material as set forth in any of <1> through <4>.

DETAILED DESCRIPTION OF THE INVENTION

Material for Transparent Conductive Film

The material for the transparent conductive film according to the present invention comprises a metal mixed oxide.

The metal mixed oxide includes Zn, Sn, and O, and is normally a $ZnO$—$SnO_2$ system oxide that includes, as its primary components, Zn, Sn, and O.

The metal mixed oxide includes one or more doping elements. The doping element may be Sc, Bi, Cu, Y, La, Ag, and/or Au, and preferably is Sc, Bi, and/or Cu. These may be used singly or in combination. The molar ratio of the doping element:Sn is preferably between 0.01:99.99 and 20:80, and, more preferably, between 0.05:99.95 and 10:90. The molar ratio of the doping element:Zn is preferably between 0.01:99.99 and 20:80, and, more preferably, between 0.05:99.95 and 10:90. Additionally, the molar ratio of Zn:(Sn+ doping element) is normally between 1:1 and 2:1. Furthermore, the molar ratio of (Zn+ doping element):Sn is normally between 1:1 and 2:1.

The metal mixed oxide may also contain other doping elements. The other doping elements may be, for example, transition metal elements such as elements in group 5 through group 10 in the periodic table (where group numbers are based on the IUPAC Nomenclature of Inorganic Chemistry, Revised Edition (1989)), and are, for example, Ta, Nb, V, Cr, Mn, Mo, W, and/or Re. These may be used singly or in combination. The other doping elements may substitute for a portion of the doping elements mentioned previously. The quantities of the other doping elements are normally less than about 50 mol % of the doping elements mentioned previously.

The material for the transparent conductive film may be manufactured by, for example:

(a-1) A method of weighing, mixing, and drying a predetermined ratio of a zinc-containing compound, a tin-containing compound, (another) doping element-containing compound, and any given additive, and calcining the resulting mixture; or (a-2) a method of weighing and mixing a predetermined ratio of a zinc-containing compound, a tin-containing compound, a solvent, (another) doping element-containing compound, and any given additive, and calcining the resulting mixture.

The material for the transparent conductive film wherein the material is a sintered body manufactured by, for example:

(b-1) A method of weighing and mixing a predetermined ratio of a zinc-containing compound, a tin-containing compound, (another) doping element-containing compound, and any given additive, and then molding, sintering, and, when required, adjusting the size thereon;

(b-2) a method of weighing, mixing, and drying a predetermined ratio of a zinc-containing compound, a tin-containing compound, (another) doping element-containing compound, a solvent, and any given additive, and then molding and sintering the resulting mixture;

(b-3) a method of weighing, mixing, and calcining a pre-determined ratio of a zinc-containing compound, a tin-containing compound, and (another) doping element-containing compound, and then pulverizing, molding, and sintering the resulting mixture along with any given additive;

(b-4) a method of weighing, mixing, drying, and calcining a pre-determined ratio of a zinc-containing compound, a tin-containing compound, (another) doping element-containing compound, and a solvent, and then pulverizing, molding, and sintering the resulting mixture along with any given additive.

In the present specification "(another) doping element-containing compound" refers to a doping element-containing compound or to a combination of a doping element-containing compound and a different doping element-containing compound.

In these methods, the size of the calcined product, green body, and sintered body may be adjusted as necessary. Size adjustments may be performed by cutting or grinding, and from the perspective of ease of processing, is preferably done on a green body rather than a sintered body.

The raw materials and various processing steps are explained below.

The zinc-containing compound may be zinc oxide, zinc hydroxide, zinc carbonate, zinc nitrate, zinc sulfate, zinc phosphate, zinc pyrophosphate, zinc chloride, zinc fluoride, zinc iodide, zinc bromide, zinc acetate, zinc oxalate, basic zinc carbonate, zinc alkoxide, and hydrated salts of the above, and from the perspective of ease of handling, powdered zinc oxide is preferred.

The tin-containing compound may be tin oxide ($SnO_2$, SnO), tin hydroxide, tin nitrate, tin sulfate, tin chloride, tin fluoride, tin iodide, tin bromide, tin acetate, tin oxalate, tin alkoxide, and hydrated salts of the above, and from the perspective of ease of handling, powdered $SnO_2$ is preferred.

The doping element-containing compound may be an oxide, a hydroxide, a carbonate, a nitrate, a sulfate, a phosphate, a pyrophosphate, a chloride, a fluoride, an iodide, a bromide, an acetate, an oxalate, or an alkoxide, that contains the doping element, or a hydrated salt of the above. Oxides containing a doping element are, for example, scandium oxide, bismuth oxide, copper oxide, yttrium oxide, lanthanum oxide, silver oxide, and gold oxide.

Other doping element-containing compounds may be an oxide, a hydroxide, a carbonate, a nitrate, a sulfate, a phosphate, a pyrophosphate, a chloride, a fluoride, an iodide, a bromide, an acetate, an oxalate, or an alkoxide, that contains the doping element, or a hydrated salt of the above. Oxides containing a doping element are, for example, scandium oxide, bismuth oxide, copper oxide, yttrium oxide, lanthanum oxide, silver oxide, and gold oxide.

The zinc-containing compound, tin-containing compound, and (another) doping element-containing compound should be of high purity, and preferably has a purity of, for example, 99% by weight or greater.

The additive may be, for example, a binder, a dispersing agent, or a release agent. The solvent may be an organic solvent such as ethanol, or water, or the like.

The mixing may be performed using a wet or dry method, and may use, for example, a ball mill, a vibrating mill, an attritor, a dyno mill or a dynamic mill. The mixing is preferably performed through a method whereby a uniform mixture of the zinc-containing compound, tin-containing compound, and (another) doping element-containing compound can be obtained. This type of method may be, for example, one that uses a water-soluble compound for (another) doping element-containing compound, for which an aqueous solution is prepared and then mixed with the zinc-containing compound and tin-containing compound; or may be a method that uses, as (another) dopant-containing compound, a compound that is soluble in an organic solution, to then mix the prepared solution of the compound with the zinc-containing compound and tin-containing compound; or may be a method wherein water-soluble compounds are used for the zinc-containing compound, tin-containing compound, and (another) doping element-containing compound, wherein a mixed aqueous solution of these water soluble compounds is prepared and a precipitating agent (an alkali, a carbonate, an oxalate, or the like) may be added to obtain a co-precipitate containing zinc, tin, and (another) doping element.

The drying may be performed using a method that removes the solvent from a slurry that contains the zinc-containing compound, tin-containing compound, and solvent, and may be performed through, for example, heated drying (e.g., static drying, spray drying), vacuum drying, or freeze drying.

The pulverization may be performed using, for example, a ball mill, a vibrating mill, an attritor, a dyno mill, or a dynamic mill. The pulverization and mixing may be performed simultaneously, and the mixing and pulverization of the zinc-containing compound, tin-containing compound, and (another) doping element-containing compound may be done simultaneously.

The calcination may be performed in, for example, an oxygen-containing gas atmosphere (such as air), with the highest terminal temperature of not lower than 900° C. and not higher than 1700° C., under a condition that is held for 0.5 to 48 hours, and may be performed using an electric furnace or a gas furnace. In manufacturing methods that include the sintering step, the maximum temperature arrived at for calcining is dependent on the hold time, and is preferably less than the maximum temperature for calcination.

The molding may be performed using, for example, a uniaxial press, or a cold isostatic press (CIP). Additionally, the molding may be performed through a combination of these, and may be performed through a method wherein the CIP step follows the uniaxial press step. The molding pressure is normally between 100 and 3,000 kg/cm². The green body is in the form of a disk or a square plate, or the like.

The sintering may be performed, for example, by treating the green body in an oxygen-containing gas atmosphere (such as air), with the highest terminal temperature of not lower than 900° C. and not higher than 1700° C., under a condition that is held for 0.5 to 48 hours, using an electric furnace or a gas furnace.

The molding and sintering may be performed simultaneously using a hot press or a hot isostatic press (HIP).

Transparent Conductive Film

The transparent conductive film according to the present invention is normally made from material for the transparent conductive film. The transparent conductive film is crystalline or amorphous.

The transparent conductive film may be deposited, for example, using, as the target, material for the transparent conductive film that is in the form of a sintered body. The transparent conductive film is normally deposited on a substrate.

The substrate may be, for example, glass, quartz glass, or plastic. A glass substrate is preferred from the perspective of being able to obtain it inexpensively even if there is a large surface area; however, normally the softening point is not particularly high, and so in deposition steps involving heating to 500° C. or more, glass is not well suited as a substrate. Quartz glass, which is a crystalline substrate, has a high softening point, and can be applied even in deposition steps with heating up to about 1200° C. Other crystalline substrates are made from $Al_2O_3$ (sapphire), MgO, ZSF ($ZrO_2$—$Y_2O_3$), $CaF_2$, or $SrTiO_3$.

When a substrate whereon a transparent conductive film is deposited as a transparent electrode is used as a front panel in a liquid crystal display, the substrate is preferably transparent.

The deposition may be performed through pulsed laser vapor deposition (i.e., laser ablation), sputtering, ion plating, or electron beam deposition, and is preferably performed through pulsed laser vapor deposition or sputtering. The deposition is normally performed within a chamber. The partial pressure of oxygen within the chamber is less than 1 Pa, and the substrate temperature is between room temperature (25° C.) and 1500° C., and is preferably between room temperature (25° C.) and 1100° C.

When the deposition is performed using pulsed laser vapor deposition, either the total atmospheric pressure within the chamber is held at not more than $10^{-3}$ Pa, or a gas is introduced into the chamber. The partial pressure of oxygen of the gas is preferably less than 1 Pa.

When deposition is performed using sputtering, the total atmospheric pressure within the chamber is maintained at between about 0.1 and 10 Pa, and a gas (oxygen: between 0 and 10% by volume, with the remainder being argon) is introduced into the chamber. The partial pressure of oxygen of the gas is preferably less than 1 Pa.

If the deposition is performed using electron beam vapor deposition, the method should use the material for the transparent conductive film (sintered body) as the target, or a method may be used that uses a vaporizing cell, wherein the material for the transparent conductive film (powder) is introduced.

EXAMPLES

Example 1

Doping Element: Sc (Manufacturing the Material for the Transparent Conductive Film)

Zinc oxide powder (special grade ZnO; Wako Pure Chemical Industries, Ltd.), tin oxide powder ($SnO_2$; Kojundo Chemical Laboratory Co., Ltd.; with a purity of 99.99%), and scandium oxide powder ($Sc_2O_3$; Nippon Yttrium Co., Ltd.; with a purity of 99.99%) were weighed and mixed to prepare a powder mixture with a (Zn+Sc):Sn molar ratio of 2:1 and a Zn:Sc molar ratio of 0.99:0.01. The mixture was introduced into a mold and molded with a molding pressure of 500 kg/cm² using a uniaxial press to produce a disk-shaped green body. The green body was sintered for 3 hours at 1300° C. in an oxygen atmosphere at normal pressure (1 atm) to produce sintered body 1. Sintered body 1 included Zn, Sn, O, and Sc, with a (Zn+Sc):Sn molar ratio of 2:1, and a molar ratio of Zn:Sc of 0.99:0.01.

(Formation of the Transparent Conductive Film)

Sintered body 1 was processed to make a target that was 20 mm in diameter.

The target and a quartz glass substrate facing the target were placed into a pulsed laser vapor deposition apparatus (manufactured by Seinan Industrial Co., Ltd.; model: PS-2000). A laser excimer (manufactured by Lambda Physics, Ltd.; Compex 205) was used to deposit transparent conductive film 1 onto the quartz glass substrate by irradiating the target with a KrF excimer laser beam for a deposition time of 60 minutes with a pressure within the apparatus of $10^{-3}$ Pa (max), with a substrate temperature of room temperature, and laser power of 150 mJ with a pulse frequency of 20 Hz.

(Evaluation of the Transparent Conductive Film and the Substrate)

The surface resistance (sheet resistance) of transparent conductive film 1 was measured using a Loresta-GP four point probe (manufactured by Mitsubishi Chemicals) in compliance with the JIS R 1637 standard. The surface resistance was $4.5\times10^7$ Ω/square. The film thickness of the transparent conductive film 1 was measured using a profilometer-type film thickness gauge. The film thickness was 43 nm. The resistivity of the transparent conductive film 1 was calculated using Equation (1) from the surface resistance and film thickness:

$$\text{Resistivity (Ω-cm)} = \text{surface resistance (Ω/square)} \times \text{film thickness (cm)} \tag{1}$$

The resistivity of transparent conductive film 1 was 200 Ω-cm.

The optical transmittance of the quartz glass substrate on which transparent conductive film 1 was deposited was measured in compliance with the JIS R 1635 standard using a visible spectrophotometer (Otsuka Co., Ltd.; MCPD-1000). The optical transmittance at a wavelength of 550 nm was 87%, and the average optical transmittance for wavelengths between 380 nm and 780 nm was 88%. The average optical transmittance of the quartz glass substrate for wavelengths between 380 nm and 780 nm prior to film deposition was 94%. The results are illustrated in Tables 1 and 2.

Example 2

Doping Element: Bi

A sintered body 2 was obtained through identical procedures as in the manufacturing of material for the transparent conductive film in the first embodiment, with the exception of using as raw materials zinc oxide powder (special grade ZnO; Wako Pure Chemical Industries, Ltd.), tin oxide powder ($SnO_2$; Kojundo Chemical Laboratory Co., Ltd.; with a purity of 99.99%), and bismuth oxide powder ($Bi_2O_3$; Kojundo Chemical Laboratory Co., Ltd.; with a purity of 99.99%) to prepare a powder mixture with a Zn:(Sn+Bi) molar ratio of 2:1, and a Sn:Bi molar ratio of 0.99:0.01.

For sintered body 2, deposition of the transparent conductive film was performed in the same manner as for the first embodiment, and evaluation of the transparent conductive film and substrate were also performed under identical conditions. The results are illustrated in Tables 1 and 2.

Example 3

Doping Element: Cu

A sintered body 3 was obtained through identical procedures as in the manufacturing of material for the transparent conductive film in the first embodiment, with the exception of using as raw materials zinc oxide powder (special grade ZnO; Wako Pure Chemical Industries, Ltd.), tin oxide powder ($SnO_2$; Kojundo Chemical Laboratory Co., Ltd.; with a purity of 99.99%), and copper oxide powder (CuO; Kojundo Chemical Laboratory Co., Ltd.; with a purity of 99.99%) to prepare a powder mixture with a Zn:(Sn+Cu) molar ratio of 2:1, and a Sn:Cu molar ratio of 0.99:0.01.

For sintered body 3, deposition of the transparent conductive film was performed in the same manner as for the first embodiment, and evaluation of the transparent conductive film and substrate were also performed under identical conditions. The results are illustrated in Tables 1 and 2.

Comparative Example 1

Doping Element: None

A sintered body 4 was obtained through identical procedures as in the manufacturing of material for the transparent conductive film in the first embodiment, with the exception of using as raw materials zinc oxide powder (special grade ZnO; Wako Pure Chemical Industries, Ltd.) and tin oxide powder ($SnO_2$; Kojundo Chemical Laboratory Co., Ltd.; with a purity of 99.99%) to prepare a powder mixture with a Zn:Sn molar ratio of 2:1.

For sintered body 4, deposition of the transparent conductive film was performed in the same manner as for the first embodiment, and evaluation of the transparent conductive film and substrate were also performed under identical conditions. The results are illustrated in Tables 1 and 2.

Comparative Example 2

Doping Element: Al

A sintered body 5 was obtained through identical procedures as in the manufacturing of material for the transparent conductive film in the first embodiment, with the exception of using as raw materials zinc oxide powder (special grade ZnO; Wako Pure Chemical Industries, Ltd.), tin oxide powder ($SnO_2$; Kojundo Chemical Laboratory Co., Ltd.; with a purity of 99.99%), and aluminum oxide powder ($Al_2O_3$, Alumina C; Degussa) to prepare a powder mixture with a (Zn+Al):Sn molar ratio of 2:1, and a Zn:Al molar ratio of 0.99:0.01.

For sintered body 5, deposition of the transparent conductive film was performed in the same manner as for the first embodiment, and evaluation of the transparent conductive film and substrate were also performed under identical conditions. The results are illustrated in Tables 1 and 2.

Comparative Example 3

Doping Element: Ga

A sintered body 6 was obtained through identical procedures as in the manufacturing of the material for the transparent conductive film in the first embodiment, with the exception of using as raw materials zinc oxide powder (special grade ZnO; Wako Pure Chemical Industries, Ltd.), tin oxide powder ($SnO_2$; Kojundo Chemical Laboratory Co., Ltd.; with a purity of 99.99%), and gallium oxide powder ($Ga_2O_3$; Tama Chemicals) to prepare a powder mixture with a (Zn+Ga):Sn molar ratio of 2:1 and a Zn:Ga molar ratio of 0.99:0.01.

For sintered body 6, deposition of the transparent conductive film was performed in the same manner as for the first embodiment, and evaluation of the transparent conductive film and substrate were also performed under identical conditions. The results are illustrated in Tables 1 and 2.

TABLE 1

Physical Properties of the Transparent Conductive Films

| | | | Transparent Conductive Film | | |
|---|---|---|---|---|---|
| | | Doping Element | Surface Resistance $\Omega$/Square | Film Thickness (nm) | Resistivity ($\Omega$-cm) |
| Example 1 | Sintered Body 1 | Sc | $4.5 \times 10^7$ | 43 | 200 |
| Example 2 | Sintered Body 2 | Bi | $5.5 \times 10^7$ | 28 | 200 |
| Example 3 | Sintered Body 3 | Cu | $9.7 \times 10^7$ | 58 | 600 |
| Comparative Example 1 | Sintered Body 4 | — | $1 \times 10^{13}$ | 94 | $9 \times 10^7$ |
| Comparative Example 2 | Sintered Body 5 | Al | $6 \times 10^{12}$ | 50 | $3 \times 10^7$ |
| Comparative Example 3 | Sintered Body 6 | Ga | $6 \times 10^{12}$ | 50 | $3 \times 10^7$ |

TABLE 2

Physical Properties of Quartz Glass Substrates on which the Transparent Conductive Films are Deposited

| | | Quartz Glass Substrate on Which the Transparent Conductive Film Was Deposited | | Quartz Glass Substrate |
|---|---|---|---|---|
| | | Optical Transmittance (%) at 550 nm | Average Optical Transmittance (%) at 380 to 780 nm | Average Optical Transmittance (%) at 380 to 780 nm |
| Example 1 | Sintered Body 1 | 87 | 88 | 94 |
| Example 2 | Sintered Body 2 | 60 | 62 | 94 |
| Example 3 | Sintered Body 3 | 80 | 82 | 94 |
| Comparative Example 1 | Sintered Body 4 | 86 | 76 | 94 |
| Comparative Example 2 | Sintered Body 5 | 66 | 67 | 94 |
| Comparative Example 3 | Sintered Body 6 | 65 | 65 | 94 |

The present invention provides material for a transparent conductive film for forming a transparent conductive film with a superior balance between resistivity and transparency. The transparent conductive film has low resistivity and high optical transmittance and so, in practice, is well-suited for use as display electrodes for liquid crystal displays, organic electroluminescent displays, plasma displays, and the like, and well-suited for use as photovoltaic cell electrodes, heat ray reflective films for windows, anti-static films, and the like.

The invention claimed is:

1. A material for making a transparent conductive film, wherein the material comprises a metal mixed oxide comprising Zn, Sn, O, and at least one doping element selected from the group consisting of Sc, Bi, Cu, Y, La, Ag, and Au,
   wherein the molar ratio of Zn:(Sn+doping element) is between 1:1 and 2:1 or the molar ratio of (Zn+doping element):Sn is between 1:1 and 2:1.

2. The material set forth in claim 1, wherein the doping element is a single doping element selected from the group consisting of Sc, Bi, Cu, Y, La, Ag, and Au.

3. The material set forth in claim 1, wherein the doping element:Sn molar ratio is between 0.01:99.99 and 20:80.

4. The material set forth in claim 1, wherein the doping element:Zn molar ratio is between 0.01:99.99 and 20:80.

5. The material set forth in claim 1, wherein the material is in the form of a sintered body.

6. A method for manufacturing a transparent conductive film comprising depositing the material of claim 1 onto a substrate.

7. A transparent conductive film comprising the material of claim 1.

* * * * *